United States Patent [19]
Yokoyama

[11] Patent Number: 6,014,095
[45] Date of Patent: Jan. 11, 2000

[54] VARIABLE LENGTH ENCODING SYSTEM

[75] Inventor: Yutaka Yokoyama, Tokyo, Japan

[73] Assignee: NEC Corporation, Tokyo, Japan

[21] Appl. No.: 08/998,665

[22] Filed: Dec. 29, 1997

[30] Foreign Application Priority Data

Dec. 27, 1996 [JP] Japan .................................. 8-358286

[51] Int. Cl.[7] .................................................. H03M 7/40
[52] U.S. Cl. ............................. 341/67; 341/63; 341/60; 348/423; 348/403; 382/245; 382/246
[58] Field of Search ................................. 341/60, 63, 65, 341/67; 348/403, 420, 423; 382/245, 246

[56] References Cited

U.S. PATENT DOCUMENTS

| | | | |
|---|---|---|---|
| 5,381,144 | 1/1995 | Wilson et al. | 341/67 |
| 5,400,075 | 3/1995 | Savatier | 341/67 |
| 5,539,401 | 7/1996 | Kumaki et al. | 341/67 |
| 5,563,593 | 10/1996 | Puri | 341/67 |
| 5,644,306 | 7/1997 | Brent | 341/67 |
| 5,835,145 | 11/1998 | Ouyang et al. | 341/65 |

FOREIGN PATENT DOCUMENTS

| | | |
|---|---|---|
| 4-119013 | 4/1992 | Japan . |
| 4-142163 | 5/1992 | Japan . |
| 8-79091 | 3/1996 | Japan . |

*Primary Examiner*—Howard L. Williams
*Attorney, Agent, or Firm*—Sughrue, Mion, Zinn, Macpeak & Seas, PLLC

[57] ABSTRACT

There is provided a high speed variable length coding system having a small hardware scale. This variable length coding system includes a variable length code table, a memory for storing quantized DCT coefficients, a section for sequentially coding the read-out quantized DCT coefficients, so as to output a variable length code table address in the case of a variable length code, and a code word and a code length in the case of a fixed length code, a section for coding information to be coded other than the quantized DCT coefficients, so as to output a variable length code table address in the case of a variable length code and a code word and a code length in the case of a fixed length code, a selector for selecting an address for the variable length code, a selector for selecting a code of the fixed length code, a delay circuit for delaying the code of the fixed length code, a selector for selecting one of the variable length code and the fixed length code, and a unit for putting the selected codes in a string so as to form a code string.

8 Claims, 13 Drawing Sheets

Fig. 2 PRIOR ART

| INPUT DATA | DATA NUMBER IN TABLE PLUS REMAINING DATA | VARIABLE LENGTH CODE DATA | LENGTH OF WHOLE |
|---|---|---|---|
| 1 | 0+'11' | 11 | 6 |
| 2 | 1+'100' | 0100 | 7 |
| 3 | 2+'101' | 00101 | 7 |
| 4 | 4+'110' | 0000110 | 7 |
| 5 | 2+'100110' | 00100110 | 10 |
| 6 | 2+'100001' | 00100001 | 10 |
| 7 | 6+'1010' | 0000001010 | 8 |

4 bits | 6 bits | 4 bits 14 bits

Fig. 3 PRIOR ART

| RANGE OF LEVEL | 11 bits | | |
|---|---|---|---|
| −1~+1 | 00 | RUN : 6 bits | LEVEL : 2 bits |
| −2,+2 | 01 | RUN : 5 bits | LEVEL : 3 bits |
| −6~−3,+3~+6 | 00 | RUN : 3 bits | LEVEL : 4 bits |
| THE OTHERS | 00 | RUN : 2 bits | LEVEL : 7 bits |

Fig. 14

| |level| | run | 7bits |
|---|---|---|
| 1 | 0–31 | `0 0` | run (5 bits) |
| 2 | 0–15 | `0 1 0` | run (4 bits) |
| 2 | 16–19 | `0 1 1 1 0` | run (2 bits) |
| 3 | 0–7 | `0 1 1 0` | run (3 bits) |
| 4 | 0–3 | `0 1 1 1 1` | run (2 bits) |
| 5–8 | 0–3 | `1 0 0` / run (2 bits) | |level| (2 bits) |
| 9–24 | 0–1 | `1 1` / run(1 bit) | |level| (4 bits) |
| 25–40 | 0 | `1 0 1` | |level| (4 bits) |

VARIABLE LENGTH ENCODING SYSTEM

BACKGROUND OF THE INVENTION

1. Field of the Invention

The present invention relates to a variable length encoding system used for coding a moving picture.

2. Description of Related Art

As a technology for coding an image data at a high efficiency, a combined system composed of a DCT (discrete cosine transformation) and a variable length coding has been standardized and widely used. However, when the pixel rate of an image to be processed is high, a processing based on a software is not sufficient in processing velocity, and a dedicated hardware becomes necessary. In addition, since a variable length code (VLC) table is used for the variable length coding, a large memory becomes necessary.

As a system intended for realizing a high speed processing, for example, Japanese Patent Application Pre-examination Publication No.

JP-A-04-119013 proposes a structure of a coding system configured to realize a high-speed real-time processing adapted to a high quality moving picture, by use of hardware, without making the circuit construction so complicated. This system uses an event memory for independently executing an event generation and an insertion of another added code for coding the DCT coefficient, thereby to realize a high speed coding processing.

FIG. 1 is a block diagram illustrating the prior art variable length coding system. In FIG. 1, Reference Numeral 201 designates an event generator receiving a quantized DCT coefficient for converting it into an event composed of a combination of the number of continuing 0s in a coefficient and a non-zero value following the continuing 0s in the coefficient, and Reference Numeral 202 denotes an event memory for temporarily storing the event thus obtained. Reference Numeral 203 indicates a code generation pre-processing unit for executing a pre-processing necessary for allocating the variable length code for the event, and Reference Numeral 204 shows a code table for allocating the variable length code for the event. Reference Numeral 205 designates a switching circuit, and Reference Numeral 206 designates a packing circuit for re-arranging the variable length code into a string of continuous bits In this example, first, the event of coefficient data corresponding to one block is generated. Namely, if an input is "0", the event generator 201 increments a counter counting the number of continuing 0s in the coefficient. If the input is a non-zero value, the event generator 201 records the number of continuing 0s and the non-zero value following the continuing 0s in the coefficient, in the event memory 202 as a set of events. In addition, the event counter 201 reset the counter counting the number of continuing 0s. This processing is repeated, and all the events corresponding to the one block are written into the event memory 202. Incidentally, a bit for discriminating the addition of "EOB" (end of block) is added to the event, and this bit is made to "ON" at the end of the block.

Then, the events written in the event memory 202 are read out in sequentially, and a code corresponding to the read-out event is generated. Prior to this processing, in the pre-processing unit, when the bit for discriminating the addition of "EOB" is "ON", an event for indicating the coding of the EOB is additionally generated.

Furthermore, the code generation pre-processing unit 203, the pre-processed event is supplied as an address for the code table 204, so that a corresponding code word of the variable length code and its code length are outputted from the code table.

In the switching circuit 205, the above processed code of the variable length code and its other adding codes are selected, and the adding code is inserted in accordance with a syntax.

Finally, in the packing circuit 206, a drain of bits continuing from an input sign is constructed.

As a prior art method for reducing the size of the variable length code table, methods disclosed in for example Japanese Patent Application Pre-examination Publication No. JP-A-04-142163 and No. JP-A-08-079091 have been known.

In the variable length coding system disclosed in JP-A-04-142163, since more significant bits of the code word of the variable length code have a feature that there is high possibility that a pattern of the same code is repeated, the code words stored in the variable length code table are represented by the length of the pattern repeating the same bit and the remaining code, as shown in FIG. 2.

According to the representation, in order to represent the code of the DCT coefficients of the MPEG (Moving Picture Experts Group) 1, 4 bits are used for representing the repetition number, and 6 bits are used for the remaining data. Furthermore, 4 bits are used for represent the code length, and therefore, the length of the whole is represented by 14 bits per one code.

In the system disclosed by JP-A-08-079091, the code is classified into four classes in accordance with the range of coefficient value (level). The address of the variable length code table corresponding to a combination of the number (or run) of continuing 0s in the coefficient and the level, is constituted of the fixed length as a whole, which includes a flag region discriminated in accordance with the class, a region indicative of the run, and a region indicative of the level. The sizes of the run region and the level region are determined to a minimum size required to store a maximum value included in the respective classes. For example, in order to represent the code of the DCT coefficients of MPEG1, 11 bits are used in the example shown in FIG. 3.

However, the above mentioned prior art systems have the following problems:

A first problem is that, in the above mentioned prior art system using the event memory, a memory capacity larger than the coefficient data is necessary.

The reason for this is that; Since the event memory must comply with occurrence of a maximum event number, the event memory is required to have a memory capacity capable of storing the events of the number at least equal to the number of coefficient data items. In addition, since it is necessary to record the zero run information and the EOB flag in addition to the non-zero coefficient value, the bit width required for one event becomes larger than the coefficient data.

A second problem is that, when many effective coefficients are generated, the advantage of a high speed processing attributable to a parallel processing cannot be obtained or is broken down.

The reason for this is that: When many effective coefficients are generated, and therefore, when the number of events becomes large, even if the event generating processing is executed in the course of a process for inserting the adding data, the number of code words to be coded including the adding data often becomes larger than the number of the input DCT coefficients. In addition, the writing and the reading of the event cannot be executed simultaneously, if the number of events becomes large, there is possibility that the coding processing for one block has not been completed during one block period.

A third problem is that a real time processing cannot be guaranteed.

The reason for this is that: Since the event memory is used, a delay from the inputting of the DCT coefficients to the outputting of the corresponding code is not at constant. In addition, since the writing and the reading of the event cannot be executed simultaneously, if the number of events becomes large, there is possibility that the delay becomes large.

A fourth problem is that, whether or not the coding processing for the event is ceaselessly executed at a fixed delay, is indefinite.

The reason for this is that: Only the variable length coding processing with reference to the code table is prepared, but neither the fixed length coding processing for the fixed length code such as the escape code, nor the processing for the intra-DC component is prepared.

A fifth problem is that, the above mentioned prior art system for reducing the size of the variable length code table is not sufficient to reduce the size of the variable length code table.

The reason for this is that: In the method for recording the repetition number of the same bit, the memory is used even for recording the repetition number, and therefore, the reduction of the bit width of the code word is not sufficient. In addition, with classification based on only the level, there still exist many invalid regions in which an address is defined for a combination of the run and the level for which a variable length code is not allocated.

SUMMARY OF THE INVENTION

Accordingly, it is an object of the present invention to provide a variable length coding system which has overcome the above mentioned problems.

Another object of the present invention is to provide a high-speed, simple-construction, variable length coding system capable of ceaselessly executing a coding processing with a fixed delay regardless of the value of an inputted DCT coefficient, so as to avoid the drop of the efficiency and the breakdown even at a high bit rate, thereby to guarantee the real time processing.

A further object of the present invention to provide a variable length coding system having a reduced size of hardware by reducing the memory capacity and the bit width.

In order to achieve the above mentioned objects, a variable length coding system in accordance with a first aspect of the present invention comprises a memory of storing variable length codes, a memory means for storing quantized DCT coefficients, means sequentially reading out the quantized DCT coefficients for coding the read-out quantized DCT coefficients, this means outputting an address signal for referring to the first memory means recording the variable length codes in the case of a variable length code, this means also outputting a code word and a code length in the case of a fixed length code, means for coding information to be coded other than the quantized DCT coefficients, this means outputting an address signal for referring to the first memory means recording the variable length codes in the case of a variable length code, this means also outputting a code word and a code length in the case of a fixed length code, means for selecting an address for the variable length code from a group of candidates, means for selecting a code of the fixed length code from a group of candidates, means for delaying the code of the fixed length code by a fixed delay period, means for selecting one of the variable length code and the fixed length code, and means for putting the selected codes in a string so as to form a code string.

Furthermore, a variable length coding system in accordance with a second aspect of the present invention comprises a memory of storing variable length codes, a memory means for storing quantized DCT coefficients, means sequentially reading out the quantized DCT coefficients for coding the read-out quantized DCT coefficients, this means outputting an address signal for referring to the first memory means recording the variable length codes in the case of a variable length code, this means also outputting a code word and a code length in the case of a fixed length code, means for coding information to be coded other than the quantized DCT coefficients, this means outputting an address signal for referring to the first memory means recording the variable length codes in the case of a variable length code, this means also outputting a code word and a code length in the case of a fixed length code, means for selecting an address for the variable length code from a group of candidates, means for selecting a code of the fixed length code from a group of candidates, means for delaying the code of the fixed length code by a fixed delay period, means for combining the variable length code and the fixed length code to generate another code, means for selecting one of the fixed length code and the another code composed of the combined variable length code and fixed length code, and means for putting the selected codes in a string so as to form a code string.

Moreover, a variable length coding system in accordance with a third aspect of the present invention is that, in the variable length coding system in accordance with the first aspect or the second aspect of the present invention, the means for coding the quantized DCT coefficients includes means for counting the number of continuing 0s in the coefficient, means for converting the value of the coefficient into an absolute value and a sign, means for generating an address for the first memory means storing the variable length codes, from the absolute value of the coefficient having the continuing 0s, means for discriminating from the number of continuing 0s and the absolute value of the coefficient, whether or not the combination is a combination for which the variable length code is defined, the means generating the code of the fixed length code when the combination is the combination for which the variable length code is not defined, a memory means of storing the value of a specific coefficient in the past block, means for obtaining a difference value between the value of the specific coefficient in the past block and the value of the inputted coefficient, means for outputting a fixed length code indicative of the difference value and an address of the variable length code indicative of the difference value, all the above mentioned operations being executed in parallel within the same processing delay, means for selecting the address of the variable length code to be outputted, from the groups of candidates of the addresses generated as mentioned above, and means for selecting the fixed length code to be outputted, from the above mentioned group of candidates of the fixed length codes generated as mentioned above.

In addition, a variable length coding system in accordance with a fourth aspect of the present invention is that, in the variable length coding system in accordance with the first aspect or the second aspect of the present invention, the memory means for recording the variable length code has portions for storing the code length and the code word of the variable length codes, respectively, and records the variable length codes with the code word being obtained by omitting most significant bits by the number fixed in accordance with the code length, the code word being able to be reproduced on the basis of the code length.

Furthermore, a variable length coding system in accordance with a fifth aspect of the present invention is that, in the variable length coding system in accordance with the first aspect or the second aspect of the present invention, the memory means for recording the variable length code records the variable length code in such a manner that the addresses of the memory recording the codes each corresponding to a combination of the number of continuing 0s in the coefficient and the absolute value of the coefficient, are classified in accordance with the combination of the number of continuing 0s in the coefficient and the absolute value of the coefficient, and in each class, a flag identifying the class, the least significant bits of the coefficient having the continuing 0s, and the least significant bits of the absolute value of the coefficient are combined to generate the above mentioned address.

BRIEF DESCRIPTION OF THE DRAWINGS

FIG. 2 is a view illustrating the construction of the prior art variable length code table;

FIG. 3 is a view illustrating the prior art method for generating the address for the variable length code table;

FIG. 14 is a view for illustrating the method for generating the address for the variable length code table, in one embodiment of the present invention.

DESCRIPTION OF THE PREFERRED EMBODIMENTS

Figure 1:
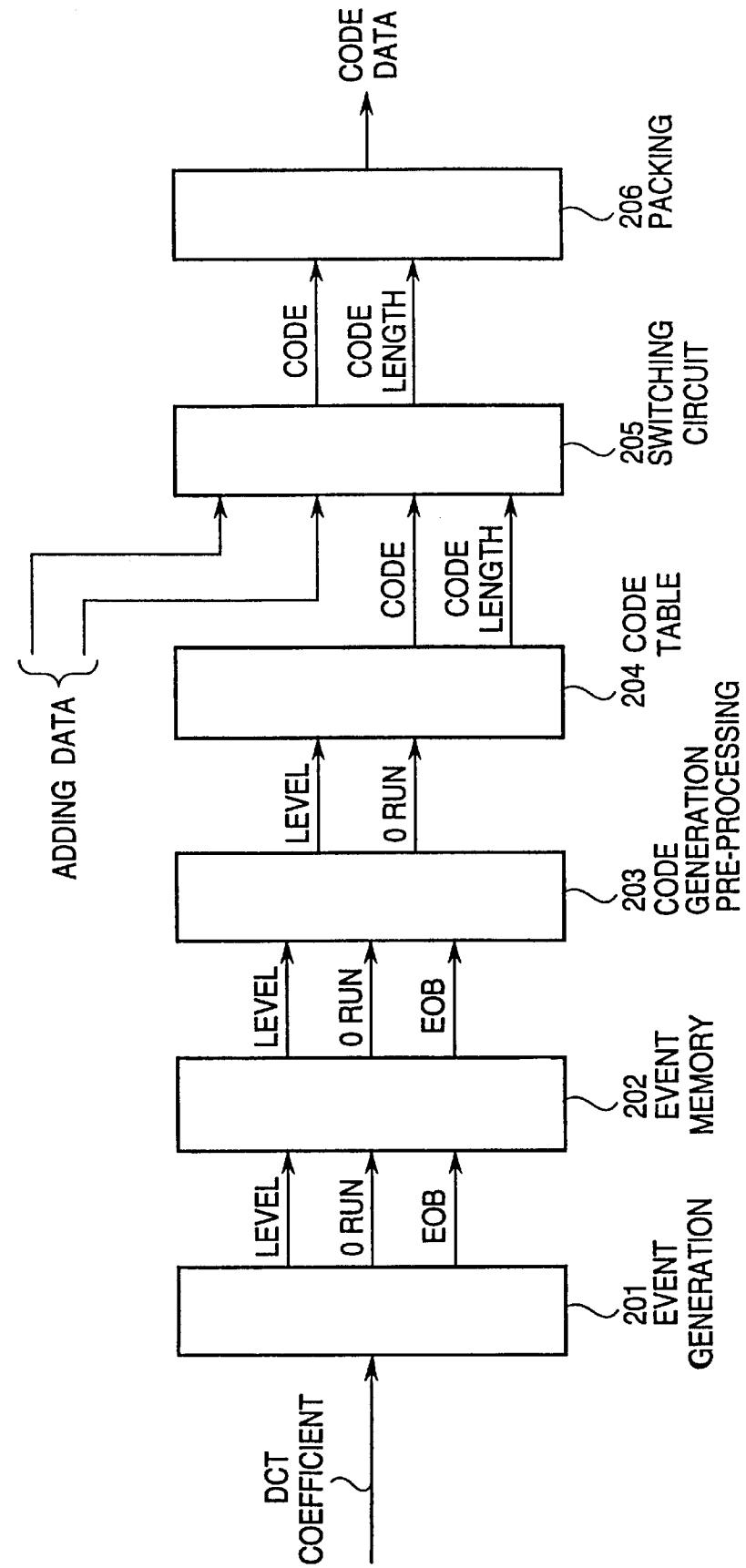
FIG. 1 is a block diagram illustrating the construction of one example of the prior art variable length coding system.

Now, embodiments of the present invention will be described. The variable length coding system in accordance with the present invention comprises, in a preferred embodiment, a means (107 in FIG. 5) for delaying a code of a fixed length code by a fixed delay period and a means (108 in FIG. 5) for selecting one of the variable length code and the fixed length code. In addition, a DCT coefficient memory (101 in FIG. 5) which can be written and read simultaneously, is provided in place of the event memory (See FIG. 1) in the prior art system.

Namely, in a preferred embodiment of the present invention, the variable length coding system comprises a memory (variable length code table 106 in FIG. 5) storing variable length codes, a memory (101 in FIG. 5) for storing quantized DCT coefficients, a means (102 in FIG. 5) sequentially reading out the quantized DCT coefficients for coding the read-out quantized DCT coefficients, this means outputting an address signal for referring to the memory recording the variable length codes in the case of a variable length code, this means also outputting a code word and a code length in the case of a fixed length code, a means (103 in FIG. 5) for coding information to be coded other than the quantized DCT coefficients, this means outputting an address signal for referring to the memory recording the variable length codes in the case of a variable length code, this means also outputting a code word and a code length in the case of a fixed length code, a means (104 in FIG. 5) for selecting an address for the variable length code from a group of candidates, a means (105 in FIG. 5) for selecting a code of the fixed length code from a group of candidates, a means (107 in FIG. 5) for delaying the code of the fixed length code by a fixed delay period, a means (108 in FIG. 5) for selecting one of the variable length code and the fixed length code, and a means (109 in FIG. 5) for putting the selected codes in a string so as to form a code string.

In the embodiment of the present invention, the means (107 in FIG. 5) for delaying the code of the fixed length code by the fixed delay period, adjusts the timing difference between the code of the fixed length code and the delay of the reading-out of the variable length code table referred to in the case of the variable length code, so that even if the variable length code and the fixed length code exist mixedly, the codes can be arranged continuously in a correct order.

In addition, with the DCT coefficient memory (101 in FIG. 5) which can be simultaneously written and read, even if the coefficient is read out in the course of the coding processing, since it is possible to write next data of the processing unit, no wasteful waiting time is required.

In another preferred embodiment of the present invention, the variable length coding system further comprises a means (111 in FIG. 8) for combining the variable length code and the fixed length code to generate another code, and a means (108 in FIG. 8) for selecting one of the fixed length code and the another code composed of the combined variable length code and fixed length code.

In the preferred embodiment of the present invention, the coding means for coding the quantized DCT coefficients includes a means (121 in FIG. 6) for counting the number of continuing 0s in the coefficient, a means (122 in FIG. 6) for converting the value of the coefficient into an absolute value and a sign, a means (127 in FIG. 6) for generating an address for the memory (variable length code table) storing the variable length codes, from the absolute value of the coefficient having the continuing 0s, a means (128 in FIG. 6) for discriminating from the number of continuing 0s and the absolute value of the coefficient, whether or not the combination is a combination for which the variable length code is defined, this means generating the code of the fixed length code when the combination is the combination for which the variable length code is defined, a memory means (141 in FIG. 6) of storing the value of a specific coefficient in the past block, a means (142 in FIG. 6) for obtaining a difference value between the value of the specific coefficient in the past block and the value of the inputted coefficient, a means (144 in FIG. 6) for outputting an address of the variable length code indicative of the difference value, a means (145 in FIG. 6) for outputting a fixed length code indicative of the difference value, all the above mentioned operations being executed in parallel within the same processing delay, a means (132 in FIG. 6) for selecting the address of the variable length code to be outputted, from the groups of candidates of the addresses generated as mentioned above, and a means (133 in FIG. 6) for selecting the fixed length code to be outputted, from the above mentioned group of candidates of the fixed length codes generated as mentioned above.

In addition, in the embodiment of the present invention, the memory (variable length code table) for storing the variable length code includes a means has portions for storing the code length of the variable length code and the code word, respectively, the code word being formed by omitting most significant bits by the number fixed in accordance with the code length.

Furthermore, in the embodiment of the present invention, the memory for storing the variable length code includes a means for recording the codes in such a manner that, the addresses of the memory recording the codes each corresponding to a combination of the number of continuing 0s in the coefficient and the absolute value of the coefficient, are classified in accordance with the number of continuing 0s in the coefficient and its combination with the absolute value of the coefficient, and in each class, a flag identifying the class, the least significant bits of the number of continuing 0s in the coefficient and the least significant bits of the absolute value of the coefficient are combined to generate the above mentioned address.

In the above mentioned embodiment, since the codes are recorded by omitting a portion of each code, the bit width to be recorded can be reduced.

Furthermore, since the address generating method is classified in accordance with the number of continuing 0s in the coefficient and its combination with the absolute value of the coefficient, it is possible to reduce wasteful allocation for combinations for which the variable length code is not defined, and therefore, the memory capacity of the memory for storing the variable length code.

Now, the embodiments of the present invention will be described in order to further explain the above mentioned embodiments of the present invention in detail.

Figure 4:
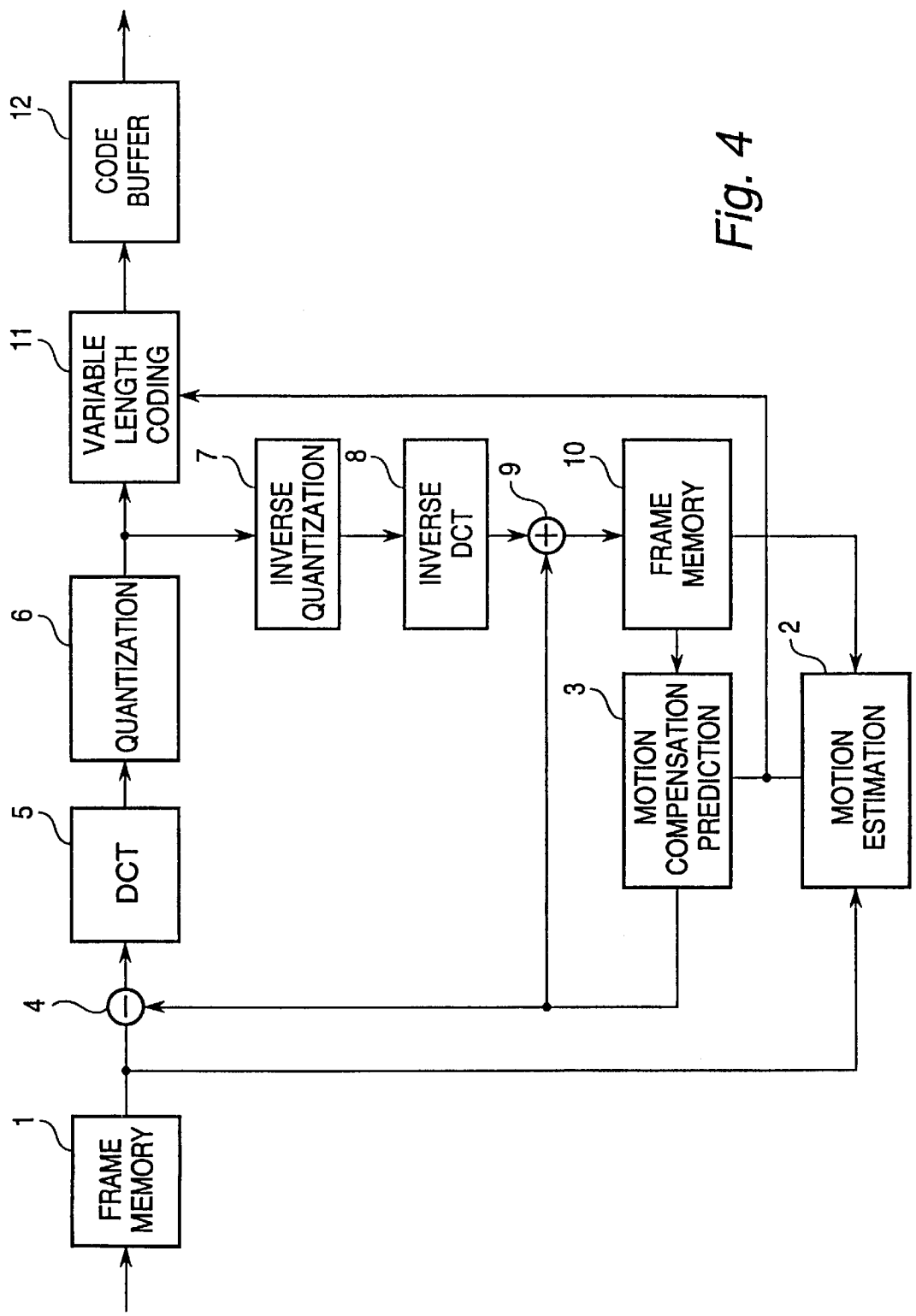
FIG. 4 is a block diagram illustrating the whole construction of one embodiment of the variable length coding system in accordance with the present invention.

FIG. 4 is a block diagram illustrating the whole construction of one embodiment of the coding system in accordance with the present invention. This is a system which is one of international standardized systems for coding a moving picture, and which is one combining a motion compensating interframe prediction and a DCT coding. For example, this is typified by the system standardized by for example MPEG1 (ISO-11172) or MPEG2 (ISO-13818).

In FIG. 4, a frame memory 1 sequentially captures an input image, and executes a re-arrangement of the coding order of images to be coded. An image signal is read out from the frame memory 1 in units of a block which is a previously determined size.

Next, for the image for which the interframe prediction is made, a motion estimator 2 searches a motion vector in units of one block, and detects a prediction mode and the motion vector. A motion compensating predictor 3 performs a motion compensating interframe prediction on the basis of the detected motion vector and prediction mode, to generate a prediction signal. Incidentally, if the interframe prediction is not performed, the prediction signal is made to all zero (0), or a signal selection is performed by a not-shown switch so that an in-frame signal is directly inputted.

Succeedingly, a subtracter 4 calculates a difference between the original signal under the coding processing and the prediction signal.

A DCT processing unit 5 orthogonally transforms the difference data outputted from the subtracter 4, by means of a discrete cosine transform (DCT), and obtains transform coefficients. The transform coefficients outputted from the DCT processing unit 5 is quantized by a quantizer 6, so that the quantized transform coefficients are outputted from the quantizer 6.

Furthermore, in order to obtain a local decoded image in the coding processing, the quantized transform coefficients are inverse-quantized by an inverse-quantizer 7, and then, are inverse-transformed by an inverse DCT processing unit 8, and further are added with the prediction signal by an adder 9, so that the local decoded signal is obtained. This local decoded signal is stored in another frame memory 10 for the interframe predicting processing and a monitoring of a code image.

On the other hand, a variable length coding unit 11 converts the quantized coefficients and the other information including the motion vector and the prediction mode, into a variable length code, so as to output a code string. The code string is stored in a code buffer 12, so that the code is outputted to an external at a predetermined timing.

As mentioned above, in order to execute a real-time processing of the image signal having a high pixel rate, the coding of the quantized transform coefficients in the variable length coding unit 11 has to be efficiently processed.

Figure 5:
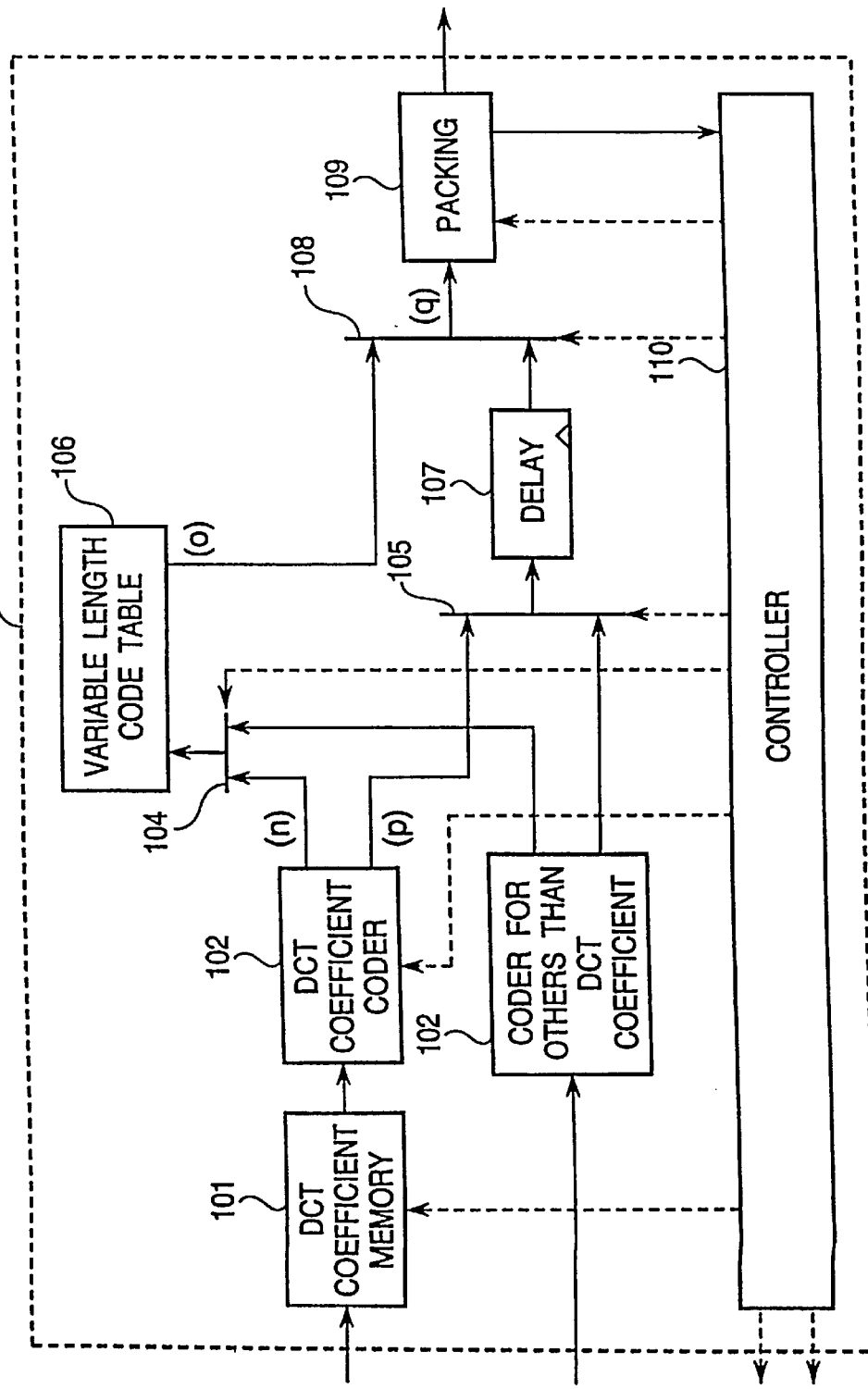
FIG. 5 is a block diagram illustrating the construction of the variable length coding unit in one embodiment of the present invention.

Next, the construction of the variable length coding unit 11 in one embodiment of the present invention will be described. FIG. 5 is a block diagram illustrating the construction of the variable length coding unit 11 in the one embodiment of the present invention.

Referring to FIG. 5, first, the quantized DCT coefficients are stored in a DCT coefficient memory 101. This DCT coefficient memory 101 can be simultaneously written and read, so that in the course of the coding processing of the DCT coefficients the DCT coefficients of the next processing unit can be written.

A DCT coefficient coder 102 sequentially reads out the coefficients from the DCT coefficient memory 101. Under the standard such as MPEG1 or MPEG2, the coefficient such as a non-zero component or an intra-DC component is converted into a code. An additional coder 103 for information other than the DCT coefficients, codes information to be coded excepting for the DCT coefficients. For example, a header code of each layer, a macro-block address, a macro-block type, a motion type, a DCT type, a quantization step size, a motion vector, a macro-block pattern, and the EOB sign are coded.

Here, a code word is a variable length code in some case and a fixed length code in another case, depending upon the value and the kind of the input data. As regards the variable length code, the code words and the code lengths are recorded in a variable length code table 106.

In the case of the variable length code, each of the DCT coefficient coder 102 and the additional coder 103 generates an address signal for referring to the variable length code table 106, so that the variable length code table 106 outputs the code word and the code length of a corresponding variable length code. On the other hand, in the case of the fixed length code, each of the DCT coefficient coder 102 and the additional coder 103 constructs the code word itself, and outputs the code word together with the code length.

A selector 104 performs the selection between the addresses of the variable length codes.

A selector 105 performs the selection between the fixed length codes.

A delay circuit 107 adjusts the outputting time of the fixed length code by considering the delay time required for referring to the variable length code table 106.

A selector 108 selects either the variable length code or the fixed length code.

Finally, a packing unit 109 puts the code words thus generated, into a string, so as to generate a code string.

Figure 6:
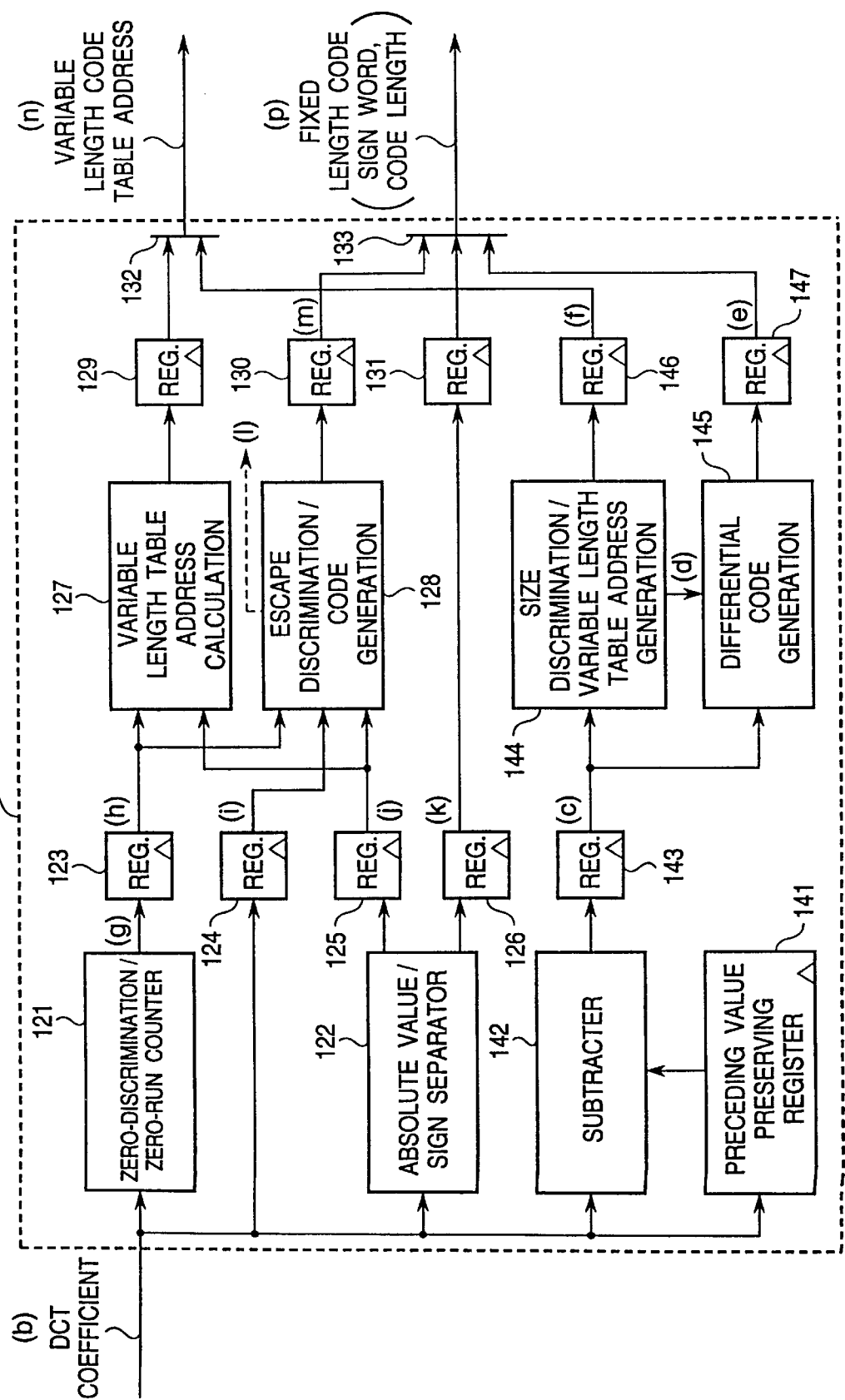
FIG. 6 is a block diagram illustrating the construction of the DCT coefficient coding unit in one embodiment of the present invention.

Next, the construction of the DCT coefficient coder 102 in one embodiment of the present invention will be described. FIG. 6 is a block diagram illustrating the construction of the DCT coefficient coder 102 in the one embodiment of the present invention.

Referring to FIG. 6, a zero discrinmination/zero-run counter 121 performs a zero discrimination of the inputted quantized DCT coefficient, counts the number of continuing 0s (zero run length), and holds the count value.

An absolute value/sign separator 122 separates the inputted quantized DCT coefficient into an absolute value and a sign. Thus, when an effective quantized DCT coefficient other than 0 (zero) is inputted, the zero-run length, the value (level) and the sign of the quantized DCT coefficient are held in registers 123, 124, 125 and 126, respectively.

A variable length code table address calculating unit 127 calculates a table address from the zero-run length (simply called a "run" hereinafter) and the value and the sign of the quantized DCT coefficient (called a "level" hereinafter), in the case of coding the coefficient into a variable length code.

An escape discrimination/code generator 128 discriminates from the combination of the run and the level, whether or not the combination is a combination for which a variable length code is not defined, and outputs an escape discrimination result. In the case of the escape, the escape discrimination/code generator 128 generates a fixed length code to output the code word and the code length of the fixed length code. This fixed length code is composed of three components, namely, a discrimination sign of the escape, the value of the run, and the value of the level.

Now, a processing for coding the intra-DC component in one embodiment of the present invention will be described. Referring to FIG. 6, first, a preceding value preserving register 141 holds the value of the intra-DC component in a just-preceding coded block. This is prepared for each color component. Alternatively, this value is reset to an initial value under a designated condition.

A subtracter 142 calculates a difference between the inputted intra-DC component and the value of the preceding block of the corresponding color component. This difference value is held in a register 143.

A size discrimination/variable length code table address conversion unit 144 discriminates the magnitude of the difference value to output the value of the size and to generate an address of a location storing a variable length code corresponding to the value of the size.

A differential code generator 145 generates and outputs a code of the difference value corresponding to the value of the size thus obtained. The address of the location storing the variable length code corresponding to the value of the size and the value of the differential code are held in registers 146 and 147, respectively.

Selectors 132 and 133 perform the selection between the variable length table addresses and the selection between the fixed length codes, respectively, so as to output one address and one fixed length code dependently upon the kind of the coefficient. Here, the fixed length code is composed of the code word and the code length, which are however indicated by only one signal line in the drawing, Incidentally, in FIG. 6, it is considered that the input coefficient is represented by two's complement, but it can be represented by another representation. For example, FIGS. 10 and 11 illustrate the construction in the case that the input coefficient is represented by an absolute value.

Figure 10:
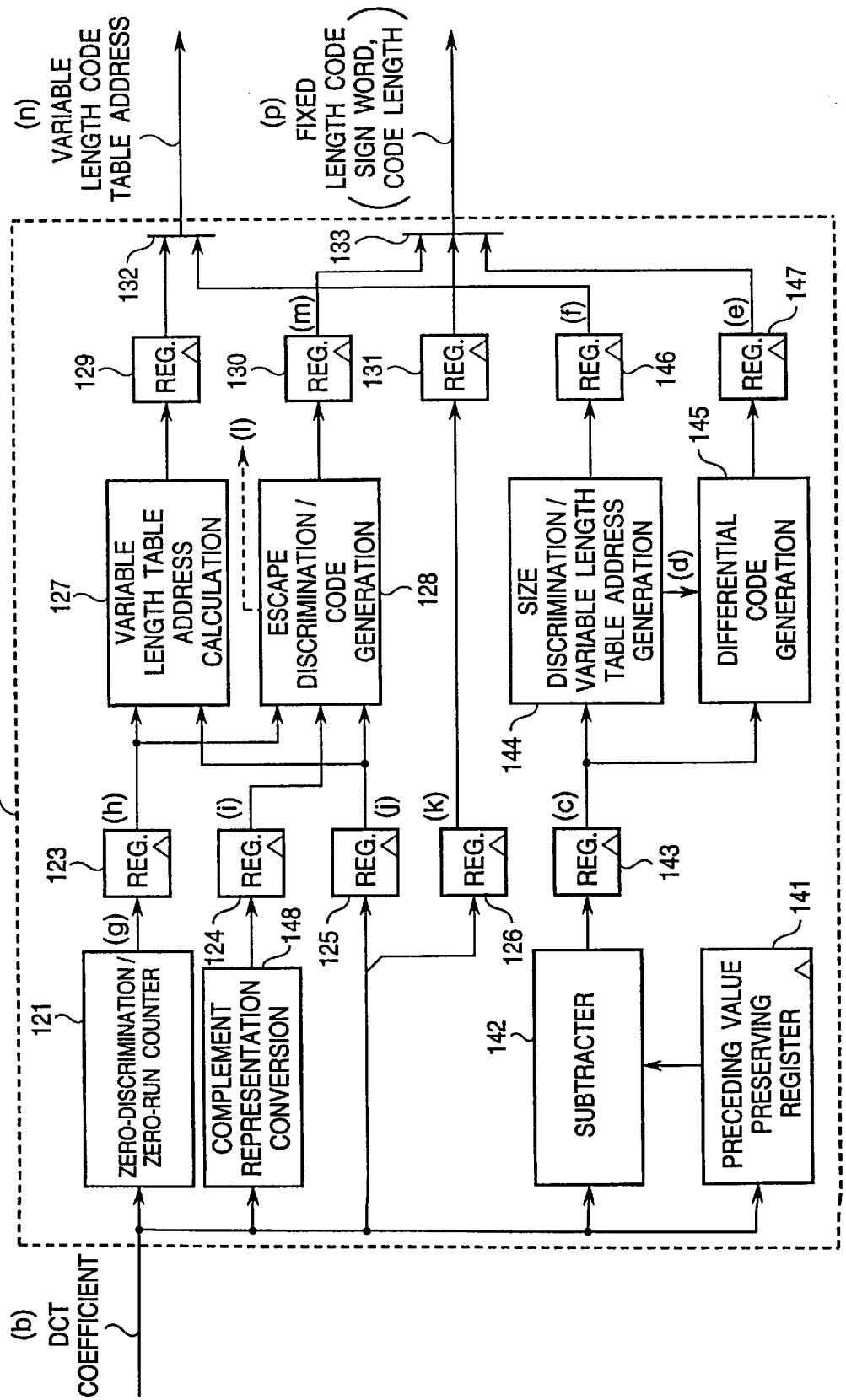
FIG. 10 is a block diagram illustrating the construction of the DCT coefficient coding unit in one embodiment of the present invention.

In FIG. 10, the value of the coefficient expressed by the two's complement and to be coded with the escape code, is converted into an absolute value representation by a complement representation converter 148.

Figure 11:
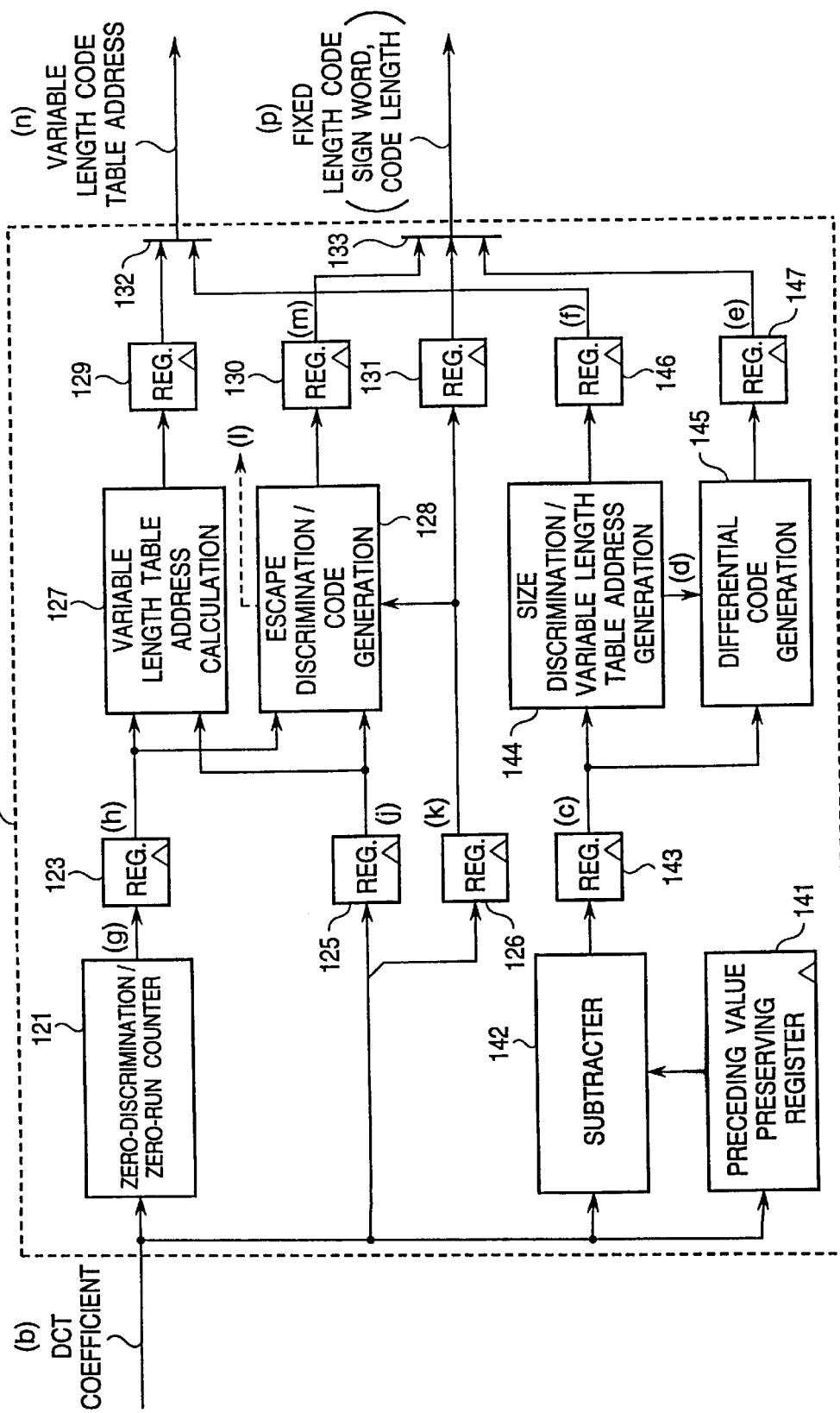
FIG. 11 is a block diagram illustrating the construction of the DCT coefficient coding unit in one embodiment of the present invention.

In FIG. 11, the value of the coefficient to be coded with the escape code, is internally generated in the escape discrimination/code generator 128, and has a construction that the code of the coefficient is added as an input. With this arrangement, the register 124 can be omitted.

Figure 7:
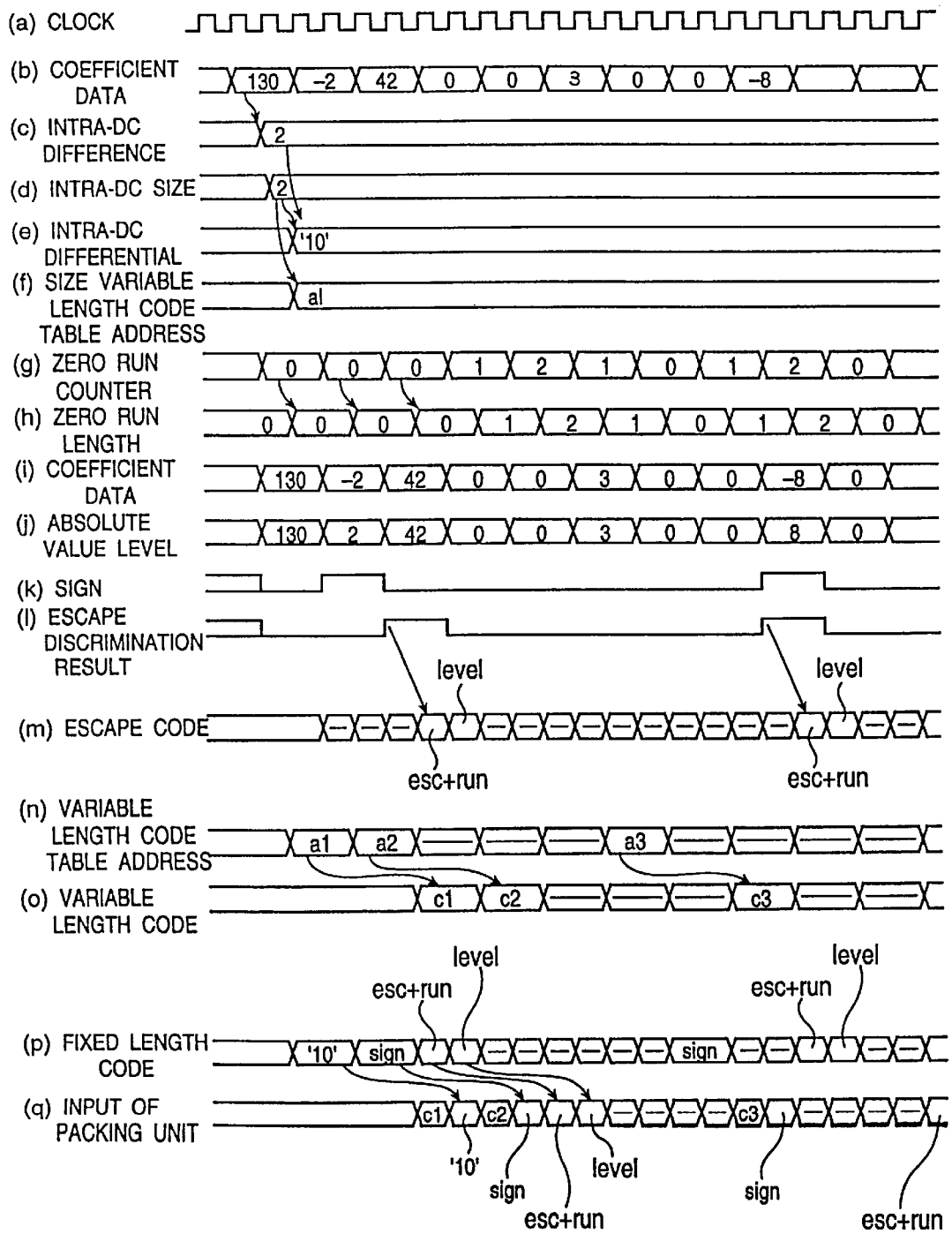
FIG. 7 is a timing chart for illustrating the operation of the code generating unit in the one embodiment of the present invention.

Next, as one embodiment of the present invention, an operation timing of the processing for coding the quantized DCT coefficients in the variable length coding unit 11 will be described. FIG. 7 is a timing chart for illustrating the operation timing. In other words, FIG. 7 illustrates an operation of the construction shown in FIGS. 5 and 6, in which one quantized DCT coefficient is inputted at each two clocks, and for one coefficient, two code constituents are outputted in order for a packing processing. The following explanation will be made on the case of the intra-block which does not perform the interframe prediction.

Referring to FIG. 7, a first inputted coefficient data "130" is an intra DC component. This signal is processed for generating an intra DC component code. Here, assuming that the intra DC component of the preceding block of the same color component as this input signal was "128", an intra DC component difference value (c) becomes "2" at a next clock, and therefore, the intra DC size (d) also becomes "2".

At the clock after the next clock, the differential value (e) becomes "10" of two bits. The address (f) of the variable length code table for indicating the size depends upon the order of the arrangement in the code table. Here, for example, assuming that the address (f) is "a1", this is settled at the same timing as that of the differential value (e).

The code word of the size can be obtained by referring to the code word at a location designated by the variable length code table address "a1".

Here, the address of the code of the intra DC size is selected by the selector 132 (in FIG. 6) and the selector 104 (in FIG. 5), so as to determine the address of the variable length code table 106.

There exists a delay of a few clocks after the address is determined until the corresponding code word is obtained. Here, assuming that the code word is obtained after lapse of three clocks, the code "c1" corresponding to the address "a1" is obtained at the timing of the variable length code (o).

At the same time, this signal (variable length code (o)) is selected by the selector 108, and outputted as an input (q) for the packing unit 109.

Referring to FIG. 7, again, the differential code is selected by the selector 133 (in FIG. 6) and the selector 105 (in FIG. 5) at a clock next to the clock where the address is settled as the fixed length code (p). Furthermore, after it is delayed in the delay circuit 107 by the delay time for referring to the variable length code, the differential code is selected by the selector 108 and outputted as the input (q) for the packing unit 109, next to the code of the size. Incidentally, the value (g) of the zero-run counter is reset to 0 (zero) since an effective coefficient has been inputted.

Referring to FIG. 7, again, it is assumed that a next inputted coefficient data is "−2". First, since this value is not "0" and therefore is an effective coefficient to be coded, the value (g) of the zero-run counter is reset to 0 (zero), and at the same time, the value of the zero-run counter until this time is set to the zero-run length (h). In addition, the DCT coefficient is latched once at a next inputted clock (i), and is converted into an absolute value representation, so that the absolute value (j) and the sign (k) are held.

Succeedingly, the escape discrimination is conducted on the basis of the combination of the value of the zero-run length (run) and the value of the coefficient value (level), so that the result of the discrimination (l) is outputted. In this case, the result is not the escape, and the data is converted into a variable length code.

At this time, the address for the variable length code table 106 is generated from the combination of the run and the level. Now, it is assumed that this address is "a2". Here, in the code word of the DCT coefficient used in the MPEG1 and MPEG2, since the last 1 bit is a code indicating the sign of the level, the table is looked up by the absolute value of the level, and finally, the sign bit is added to generate the code word.

Here, the address of the variable length code based on the combination of the run and the level, is selected by the selector 132 and the selector 104, so that the address of the variable length code table 106 is determined. As the variable length code (o), the code "c2" corresponding to the address "a2" is obtained after a delay of a few clocks as mentioned above. At the same time, this signal "c2" is selected and outputted as the input (q) to the packing unit 109.

As the fixed length code (p), the sign of the coefficient is selected and outputted by the selector 133 and 105 at the next clock for determining the address. Similarly to the above, this fixed length code is delayed by the delay circuit 107 and thereafter is selected by the selector 108 and outputted as the input (q) to the packing unit 109 at the clock next to the variable length code "c2".

Referring to FIG. 7, a next inputted coefficient data is "42". Similarly, at this time, the value (g) of the zero-run counter is reset to 0 (zero), and at the same time, the value of the zero-run counter until this time is set to the zero-run length (h).

In addition, the DCT coefficient is latched once at a next inputted clock (i), and is converted into an absolute value representation, so that the absolute value (j) and the sign (k) are held.

Succeedingly, the escape discrimination is conducted on the basis of the combination of the value of the zero-run length (run) and the value of the coefficient value (level), so that the result of the discrimination (l) is outputted.

In this case, the result becomes an escape code, At a next clock, a fixed length code obtained by converting the value of the run is combined after the discrimination code "esc" of the escape, and is outputted (m).

Here, for example in MPEG1 and in MPEG2, the discrimination code "esc" of the escape is constituted of a 6-bit code "000001". In addition, the maximum value of the run is "63", and can be expressed by 6 bits. Therefore, the code outputted in this situation is a 12-bit code obtained by coupling these codes.

At a succeeding clock, the code obtained by converting the level into the fixed length code is outputted (m). This signal is selected by the selector 133 and the selector 105 and outputted as the fixed length code (p). After this signal is delayed similarly to the above, this signal is selected by the selector 108 and outputted as the input (q) to the packing unit 109, succeeding to the code of the preceding coefficient.

After this, if the zero coefficient is inputted, the value (g) of the zero-run counter is incremented.

And, when a non-zero coefficient "3" appears as the coefficient data, the coding processing is conducted at timings similar to the above processing, and a variable length code "c3" is derived on the basis of an address "a3" for the variable length code table 106, and outputted together with the sign of the input data as the code word.

Incidentally, although not shown, the sign is expressed by a combination of a code word and a code length, however, only the code word is shown in the drawing. Actually, a corresponding code length is set at the same timing as the code word is set.

Next, explanation will be made on the case that the DCT coefficient is inputted at a different input interval. Now, consider that one quantized DCT coefficient is inputted at each one clock. At this time, it is necessary to combine a plurality of code constituents generated for one coefficient, so as to form one code word before it is outputted to the packing unit.

Figure 8:
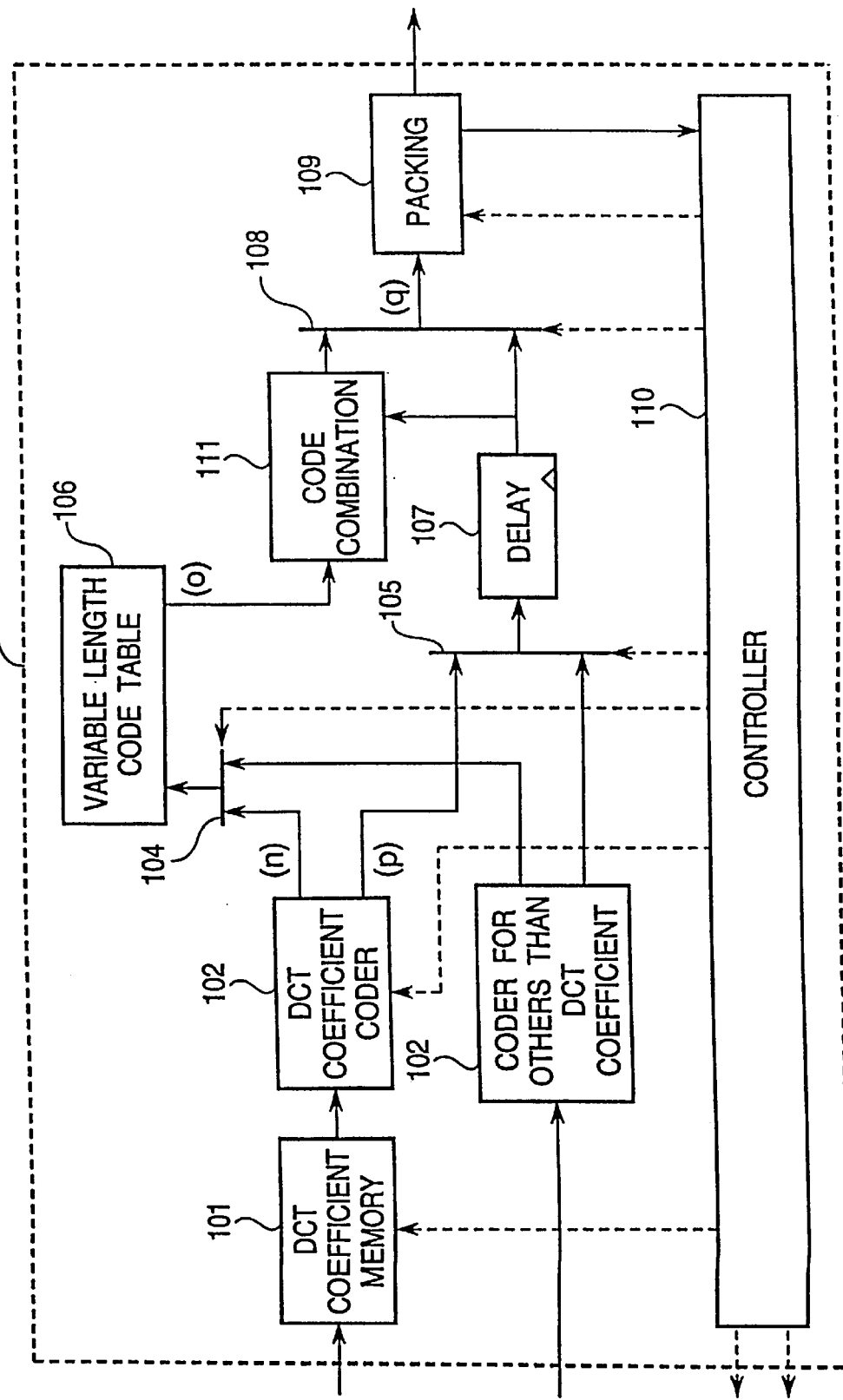
FIG. 8 is a block diagram illustrating the construction of the variable length coding unit in one embodiment of the present invention.

FIG. 8 is a block diagram illustrating the construction of the variable length coding unit in another embodiment of the present invention. In this embodiment, a code combining unit 111 is added after the output of the variable length code table 106 but before the selector 108.

The code combining unit 111 receives the variable length code outputted from the variable length code table 106 and the fixed length code outputted through the delay circuit 107 and to be coded just after the variable length, and combines the fixed length code just after the variable length code to constitute a new code.

Figure 9:
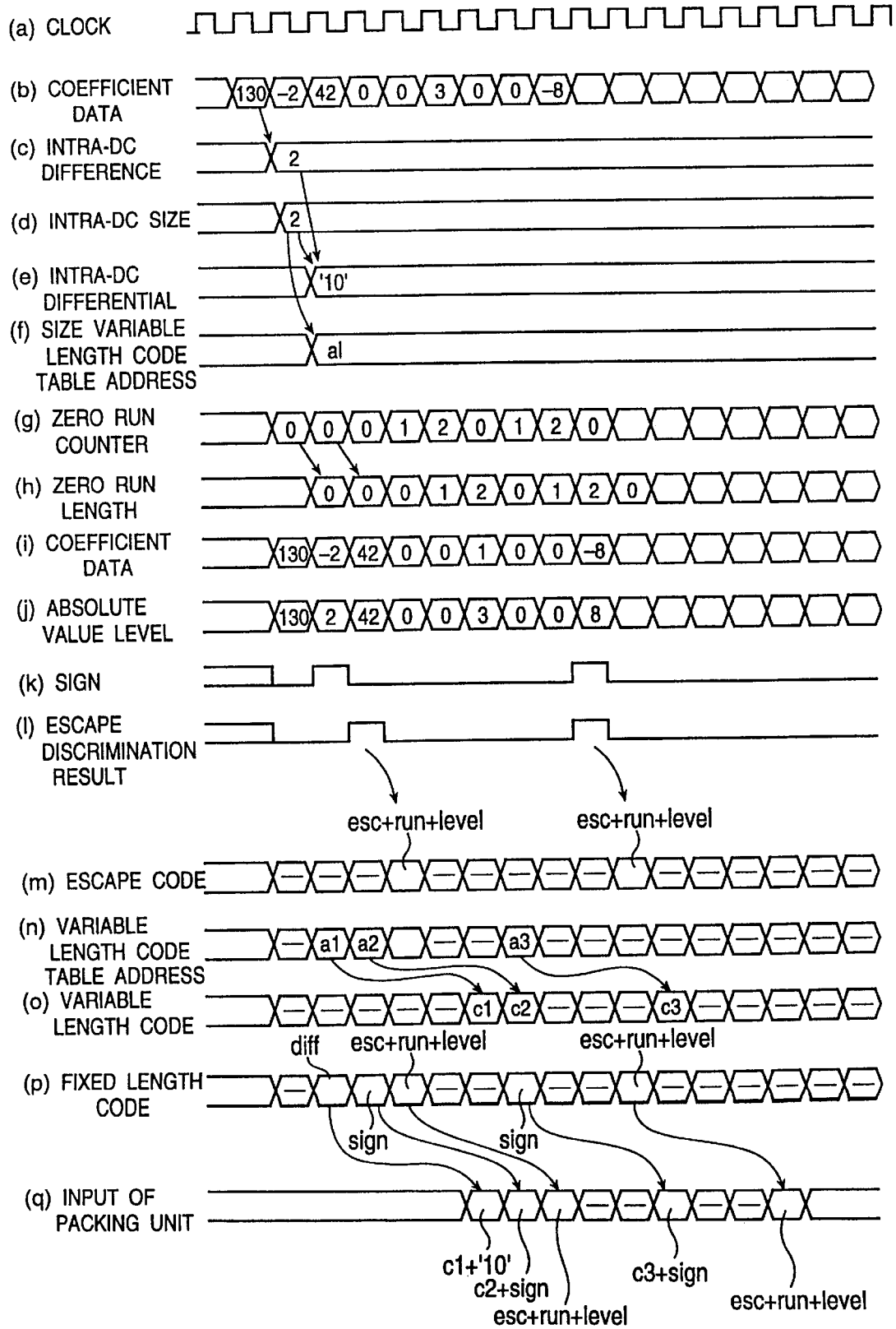
FIG. 9 is a timing chart for illustrating the operation of the code generating unit in the embodiment of the present invention.

FIG. 9 is a timing chart for illustrating an operation timing of the second embodiment of the present invention. FIG. 9 shows the case that the construction shown in FIG. 8 is used and one quantized DCT coefficient is inputted at each one clock. In this example, it is also assumed that the case is of the intra-block which does not perform the interframe prediction.

Referring to FIG. 9, a first inputted coefficient data "130" is an intra DC component This signal is processed for generating an intra DC component code. Here, assuming that the intra DC component of the preceding block of the same color component as this input signal was "128", the difference value (c) becomes "2" at a next clock, and therefore, the size (d) also becomes "2".

At the clock after the next clock, the differential value (e) becomes "10" of two bits. The address (f) of the variable length code table 106 for indicating the size depends upon the order of the arrangement in the code table. For example, assuming that the address (f) is "a1", this is settled at the same timing as that of the differential value (e).

The code word of the size can be obtained by referring to the code word at a location designated by address "a1" of the variable length code table 106. Here, the address of the code of the size is selected by the selector 132 and the selector 104 so as to determine the address of the code table.

There exists a delay of a few clocks after the address is determined until the corresponding code word is obtained. Here, assuming that the code word is obtained after lapse of three clocks, the code "c1" corresponding to the address "a1" is obtained at the timing of the variable length code (o). At the same time, this signal (code "c1") is selected by the selector 108, and outputted as an input (q) for the packing unit 109.

The differential code is outputted as the fixed length code (p), and is selected and outputted by the selector 133 and the selector 105 at the same clock as the clock where the address is settled. Furthermore, after it is delayed in the delay circuit 107 by the delay time for referring to the variable length code, the size code and the differential code are combined by the code combining unit 111, and then, is selected by the selector 108 and outputted as the input (q) for the packing unit 109, next to the code of the size. Incidentally, the value (g) of the zero-run counter is reset to 0 (zero) since an effective coefficient has been inputted.

Referring to FIG. 9, again, a next inputted coefficient data is "−2". First, since this value is not "0" and therefore is an effective coefficient to be coded, the value (g) of the zero-run counter is reset to 0 (zero), and at the same time, the value of the zero-run counter until this time is set to the zero-run length (h). In addition, the DCT coefficient is latched once at a next inputted clock (i), and is converted into an absolute value representation, so that the absolute value (j) and the sign (k) are held.

Succeedingly, the escape discrimination is conducted on the basis of the combination of the value of the zero-run length (run) and the value of the coefficient value (level), so that the result of the discrimination (l) is outputted. At this time, the address for the variable length code table 106 is generated from the combination of the run and the level. Now, it is assumed that this address is "a2". Here, since the last 1 bit of the code word is a code indicating the sign of the level, the table is looked up by the absolute value of the level, and finally, the sign bit is added to generate the code word.

Here, the address of the variable length code based on the combination of the run and the level, is selected by the selector 132 and the selector 104, so that the address of the variable length code table 106 is determined.

As the variable length code (o), the code "c2" corresponding to the address "a2" is obtained after a delay of a few clocks as mentioned above. As the fixed length code (p), the sign is selected and outputted by the selector 133 and 105 at the same clock as the clock where the address is determined. Similarly to the above, this is delayed by the delay circuit 107 and thereafter is combined with the variable length code "c2", and further, is selected by the selector 108 and outputted as the input (q) to the packing unit 109.

Referring to FIG. 9, a next inputted coefficient data is "42". Similarly, at this time, the value (g) of the zero-run counter is reset to 0 (zero), and at the same time, the value of the zero-run counter until this time is set to the zero-run length (h). In addition, the DCT coefficient is latched once at a next inputted clock (i), and is converted into an absolute value representation, so that the absolute value (j) and the sign (k) are held.

Succeedingly, the escape discrimination is conducted on the basis of the combination of the value of the zero-run length (run) and the value of the coefficient value (level), so that the result of the discrimination (l) is outputted. In this case, the result becomes an escape code.

At this time, codes obtained by converting the run and the level into fixed length codes, respectively, are combined after the discrimination code "esc" of the escape, and are outputted (m). Here, for example in MPEG2, the discrimination code "esc" of the escape is constituted of a 6-bit code "000001". On the other hand, the maximum value of the run is "63", and is expressed by 6 bits. In addition, the value of the level is expressed by 12 bits in MPEG2.

Therefore, the code outputted in this situation is a 24-bit code obtained by combining the three codes. This signal is selected by the selector 133 and the selector 105 and outputted as the fixed length code (p). After this signal is delayed by the delay circuit 107 similarly to the above, this signal is selected by the selector 108 and outputted as the input (q) to the packing unit 109, succeeding to the code of the preceding coefficient.

After this, if the zero coefficient is inputted, the value (g) of the zero-run counter is incremented. And, when a non-zero coefficient appears again, the coding processing is conducted at timings similar to the above processing, and a variable length code "c3" is derived on the basis of an address "a3" for the variable length code table 106, and outputted together with the sign of the input data as the code word.

Figure 12:
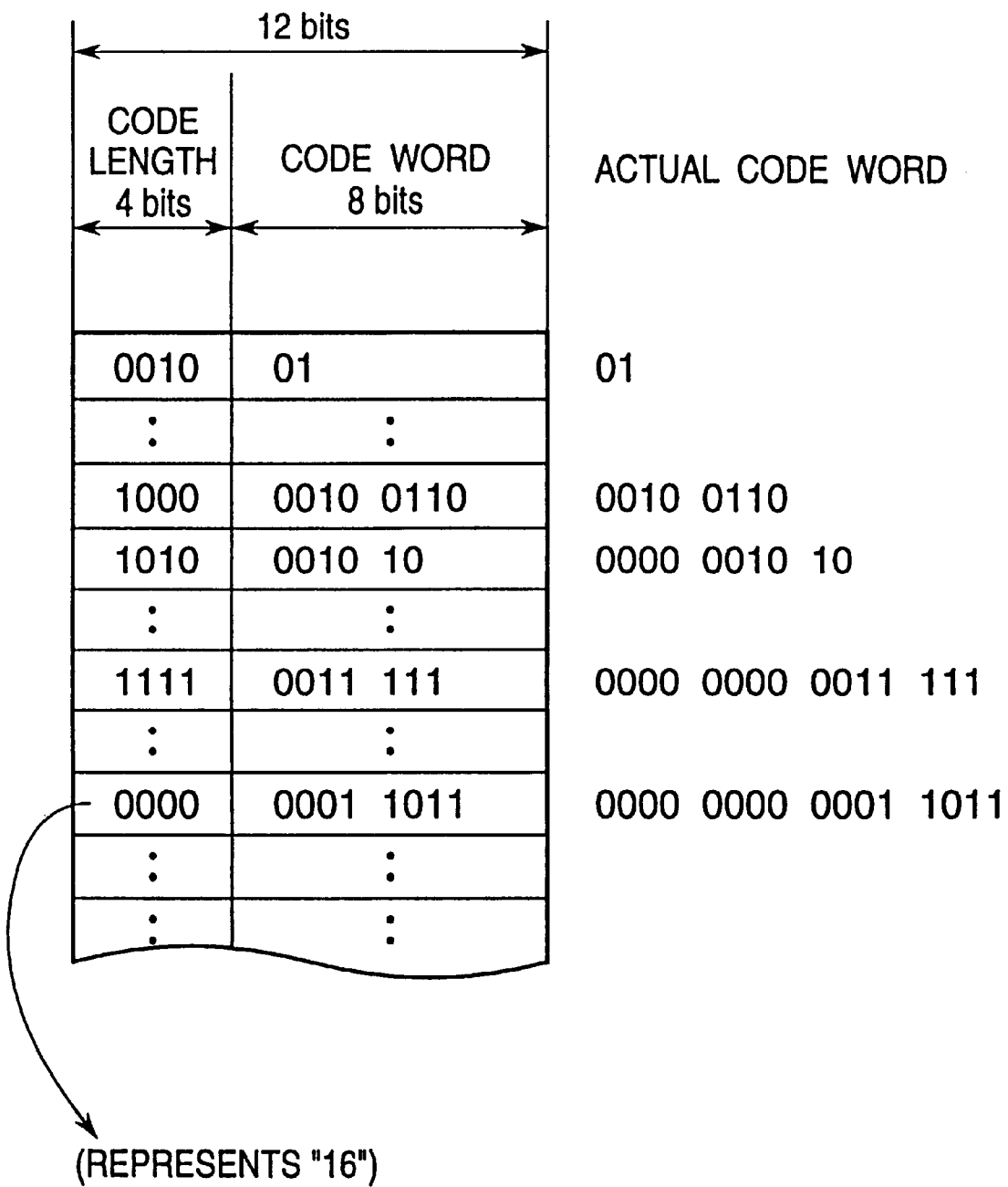
FIG. 12 is a view illustrating the construction of the variable length code table in one embodiment of the present invention.

Now, the method for constructing the variable length code table 106 in the one embodiment of the present invention will be described. FIG. 12 is a view illustrating the construction of the variable length code table 106 in the one embodiment of the present invention.

Referring to FIG. 12, one variable length code is constituted of a code word and a code length. Here, the variable length code for the DCT coefficient used in MPEG1 or MPEG2 is 17 bits at maximum, and the last one bit is a bit indicating the sign of the coefficient value. Namely, by adopting the construction of omitting the bit indicating the sign and separately combining the sign bit at a later stage, it is sufficient if the code word of 16 bits at maximum can be stored.

The feature of the code word is that there exist many code words in which the same bits (for example, "0") continue in most significant bit positions. Most significant bits of the code words are omitted by utilizing this feature, and only the remaining bits of the code words are recorded in the table. On the other hand, whether or not the most significant bits are omitted is discriminated from the code length, and if the most significant bits are omitted, the code of the omitted portion is re-combined to re-constitute an actual code word.

In the one embodiment shown in FIG. 12, the codes are classified into three classes, namely, of the code length of not greater than 8 bits, the code length of greater than 8 bits but not greater than 12 bits, and the code length of greater than 12 bits but not greater than 16 bits. In the case of the code length of not greater than 8 bits, the whole of actual code words having the code length of not greater than 8 bits is recorded in the table. In the case of the code length of greater than 8 bits but not greater than 12 bits, four most significant bits of the actual code words are omitted, and the remaining portion of the code words of not greater than 8 bits is recorded in the table. In the case of the code length of greater than 12 bits but not greater than 16 bits, eight most significant bits of the actual code words are omitted, and the remaining portion of the code words of not greater than 8 bits is recorded in the table.

With this arrangement, it is possible to omit the continuing portion of the same bits, but the portion including different bits is in no way omitted.

The code length can be expressed by 4 bits, since the maximum code length is 16 bits. For example, the code length is expressed by a binary number, and "0000" is allocated to "16". Alternatively, it is a matter of course that the value of the code leng"-1" is expressed by a binary number.

The actual code word is generated only by knowing the class of the code on the basis of the code length data and by combining the bits of the number designated by the known class of the code as most significant bit positions to the code word read out from the table.

Figure 13:
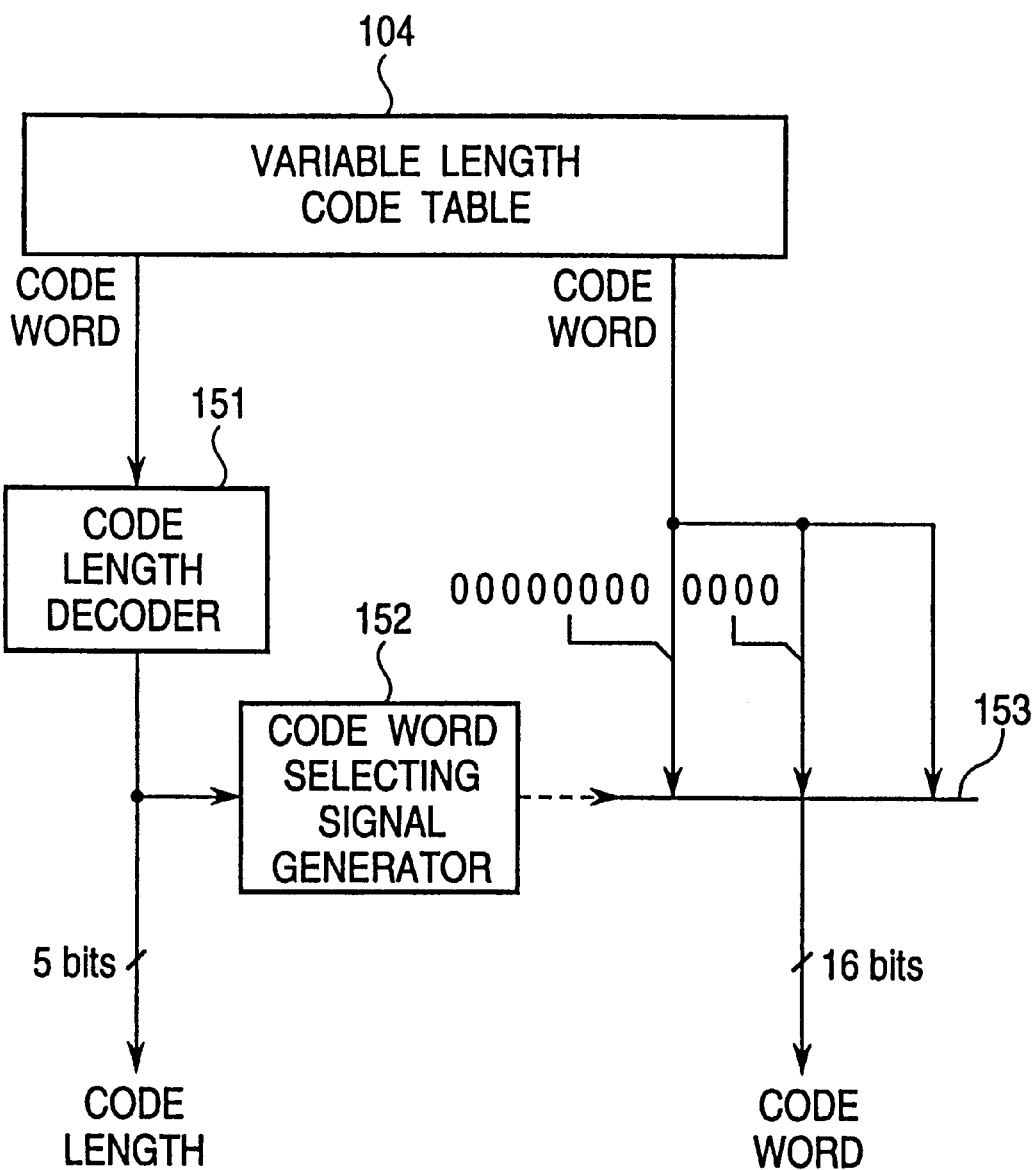
FIG. 13 is a view for illustrating the method for generating the variable length code word, in one embodiment of the present invention.

For example, as shown in FIG. 13, it is sufficient if the code added at most significant bit positions with the same bits of 8 bits ("00000000" in this embodiment), the code added at most significant bit positions with the same bits of 4 bits ("0000" in this embodiment), and the same code as the code word recorded in the table, are previously constituted, and one of them is selected in the accordance with the data of the code length. As mentioned above, since the numbers of bits to be combined are fixed, the code word can be generated in a simple construction which does not require a hardware resource such as a shifter.

As explained above, the bit width of each one code can fall within the range of 12 bits by adopting the table construction in which most significant bits of the fixed lengths are omitted.

This means that the table can be constructed with a reduced bit width in comparison with the 14 bits used in the prior art method explained with reference to FIG. 2. Namely, the memory capacity can be reduced.

Incidentally, in the above mentioned explanation, the example of handling the codes of the DCT coefficients has been described. However, it would be apparent that the above mentioned method can be applied to representation of other codes. For example, the above method can be similarly applied to the representation of codes of macroblock addresses, macro types, macroblock patterns, motion vectors, and sizes of intra-DC components.

As regards the sizes of intra-DC components, the same bits of most significant bits are a continuation of "1". In this case, therefore, it is sufficient if "1111" is added when the code word is regenerated.

Next, the method for generating the address for the variable length code table 106 in the one embodiment of the present invention will be described.

The code of the DCT coefficient is defined as the combination of the number of the continuing "0s" (run) and the non-zero coefficient value (level). However, variable length codes are not defined for all possible combinations of runs and levels.

The variable length codes are defined for only two hundred and a few ten combinations which appear with a high degree of frequency, and all of the remaining combinations are converted into a fixed length code as an escape code. Therefore, the combinations of runs and levels are classified into some number of classes, and an address is generated in accordance with each class. With this arrangement, the bit width of the address can be reduced, and therefore, the memory space can be reduced With reference to FIG. 14, one example of the method for generating the address for the variable length code table 106 will be described. As shown in FIG. 14, the addresses are classified into eight classes on the basis of the run and the absolute value of the level.

In each of the classes, a few most significant bits are fixed, and the remaining bits are constituted of least significant bits of the run or the level. For example, if the absolute value of the level is "1" and the run is not larger than "31", two most significant bits of the address are constituted of "00", and five least significant bits of the address are constituted of the five least significant bits of the value of the run. If the absolute value of the level is not smaller than "5" but not larger than "8" and the run is not larger than "3", three most significant bits of the address are constituted of "100", and two next most significant bits of the address are constituted of the two least significant bits of the value of the run, and two least significant bits of the address are constituted of the two least significant bits of the absolute value of the level.

As mentioned above, in the embodiment of the present invention, the address of the variable length code can be expressed by the address space of 7 bits by constructing the address by the combination of the run and the level.

This means that the address can be generated with a reduced bit width in comparison with the 11 bits used in the prior art method described with reference to FIG. 3. Namely, an efficient table with no waste can be constructed.

Incidentally, in the above explanation, the coding system adapted to MPEG1 or MPEG2 has been described. However, the present invention can be applied to other image coding systems, for example, H.261, H.263, JPEG,. etc.

As seen from the above, the following advantages can be obtained according to the present invention:

A first advantage of the present invention is that the memory capacity for storing the data for coding can be reduced.

The reason for this is that according to the present invention, the event memory is not used, and only the coefficient memory is used.

A second advantage of the present invention is that even if many non-zero coefficients occurs, the speeding-up effect is not reduced, and therefore, it can be applied to a coding processing of a high bit rate.

The reason for this is that in the present invention, in the course of the coding processing of the coefficient, the coefficient is read out from the coefficient memory at a fixed interval, and can be processed with a fixed delay.

A third advantage of the present invention is that, the coding processing for the effective coefficient can be executed with the fixed delay time without exception, and therefore, it is possible to ceaselessly supply the DCT coefficient data at a constant interval without disturbing the pipeline control, so that a high throughput and real time property can be obtained.

The reason for this is that, in the present invention, the processing is conducted with the same delay time, regardless of the kind of the code corresponding to the quantized DCT coefficient, namely, regardless of which of the intra-DC component, the escape and the others, the code is. In addition, in the case of the fixed length code, the outputting of the code is delayed by the time required for referring to the variable length code table, and thereafter, the code is inputted to the packing unit. Therefore, even if the fixed length code and the variable length code exist in a mixed condition, it is possible to output the codes in a proper order. The timings in the pipelined processing are never disturbed by the value and the kind of the data.

A fourth advantage of the present invention is that the size of the hardware resources can be reduced.

The reason for this is that the bit width per one code can be reduced by making the input interval of the DCT coefficients to one coefficient per two clocks. In addition, when the code for one coefficient is constituted of a plurality of code words, these code words are outputted in order, with the result that it is no necessary to combine these code words before the packing, and therefore, the control can be simplified.

A fifth advantage of the present invention is that the memory capacity for the variable length code table can be reduced.

The reason for this is that, in the present invention, the codes are recorded by omitting a portion of code words, and the storing of wasteful codes corresponding to the combinations of runs and levels for which a variable length code is not defined, is reduced.

I claim:

1. A variable length coding system, used in a moving picture coding system, comprising:

a memory of storing variable length codes;

a memory means for storing quantized DCT coefficients;

a quantized DCT coefficient coding means sequentially reading out the quantized DCT coefficients for coding the read-out quantized DCT coefficients, said quantized DCT coefficient coding means outputting an address signal for referring to said memory recording said variable length codes in the case of a variable length code, said quantized DCT coefficient coding means also outputting a code word and a code length in the case of a fixed length code;

means for coding information to be coded other than the quantized DCT coefficients, this means outputting an address signal for referring to said memory recording said variable length codes in the case of a variable length code, this means also outputting a code word and a code length in the case of a fixed length code;

means for selecting an address for the variable length code from a group of candidates;

means for selecting a code of the fixed length code from a group of candidates;

means for delaying the code of the fixed length code by a fixed delay period;

means for selecting one of the variable length code and the fixed length code; and means for putting the selected codes in a string so as to form a code string.

2. A variable length coding system claimed in claim 1 wherein said quantized DCT coefficient coding means includes:

means for counting the number of continuing 0s in the coefficient;

means for converting the value of the coefficient into an absolute value and a sign;

means for generating an address for said memory storing said variable length codes, from the absolute value of the coefficient having the continuing 0s;

means for discriminating from the number of continuing 0s and the absolute value of the coefficient, whether or not the combination is a combination for which the variable length code is defined, this means generating the code of the fixed length code when the combination is the combination for which the variable length code is not defined;

a memory means of storing the value of a specific coefficient in the past block;

means for obtaining a difference value between the value of the specific coefficient in said past block and the value of the inputted coefficient;

means for outputting a fixed length code indicative of the difference value and an address of the variable length code indicative of the difference value, all the above mentioned operations being executed in parallel within the same processing delay, means for selecting the address of the variable length code to be outputted, from the groups of candidates of the addresses generated as mentioned above; and means for selecting the fixed length code to be outputted, from the above mentioned group of candidates of the fixed length codes generated as mentioned above.

3. A variable length coding system claimed in claim 1 wherein said memory recording said variable length code has portions for storing the code length and the code word of the variable length codes, respectively, and records the variable length codes with the code word being obtained by omitting most significant bits by the number fixed in accordance with the code length, the code word being able to be reproduced on the basis of the code length.

4. A variable length coding system claimed in claim 1 wherein said memory recording said variable length code records the variable length code in such a manner that the addresses of said memory recording the codes each corresponding to a combination of the number of continuing 0s in the coefficient and the absolute value of the coefficient, are classified in accordance with the combination of the number of continuing 0s in the coefficient and the absolute value of the coefficient, and in each class, a flag identifying the class, the least significant bits of the coefficient having the continuing 0s, and the least significant bits of the absolute value of the coefficient are combined to generate the above mentioned address.

5. A variable length coding system, used in a moving picture coding system, comprising:

a memory of storing variable length codes;

a memory means for storing quantized DCT coefficients;

a quantized DCT coefficient coding means sequentially reading out the quantized DCT coefficients for coding the read-out quantized DCT coefficients, said quantized DCT coefficient coding means outputting an address signal for referring to said memory recording said variable length codes in the case of a variable length code, said quantized DCT coefficient coding means also outputting a code word and a code length in the case of a fixed length code;

means for coding information to be coded other than the quantized DCT coefficients, this means outputting an address signal for referring to said memory recording said variable length codes in the case of a variable length code, this means also outputting a code word and a code length in the case of a fixed length code;

means for selecting an address for the variable length code from a group of candidates;

means for selecting a code of the fixed length code from a group of candidates;

means for delaying the code of the fixed length code by a fixed delay period;

means for combining the variable length code and the fixed length code to generate another code;

means for selecting one of the fixed length code and the another code composed of the combined variable length code and fixed length code; and means for putting the selected codes in a string so as to form a code string.

6. A variable length coding system claimed in claim 5 wherein said quantized DCT coefficient coding means includes:

a means for counting the number of continuing 0s in the coefficient;

means for converting the value of the coefficient into an absolute value and a sign;

means for generating an address for said memory storing said variable length codes, from the absolute value of the coefficient having the continuing 0s;

means for discriminating from the number of continuing 0s and the absolute value of the coefficient, whether or not the combination is a combination for which the variable length code is defined, this means generating the code of the fixed length code when the combination is the combination for which the variable length code is not defined;

a memory means of storing the value of a specific coefficient in the past block;

means for obtaining a difference value between the value of the specific coefficient in said past block and the value of the inputted coefficient;

means for outputting a fixed length code indicative of the difference value and an address of the variable length code indicative of the difference value, all the above mentioned operations being executed in parallel within the same processing delay, means for selecting the address of the variable length code to be outputted, from the groups of candidates of the addresses generated as mentioned above; and means for selecting the fixed length code to be outputted, from the above mentioned group of candidates of the fixed length codes generated as mentioned above.

7. A variable length coding system claimed in claim 5 wherein said memory recording said variable length code has portions for storing the code length and the code word of the variable length codes, respectively, and records the variable length codes with the code word being obtained by omitting most significant bits by the number fixed in accordance with the code length, the code word being able to be reproduced on the basis of the code length.

8. A variable length coding system claimed in claim 5 wherein said memory recording said variable length code records the variable length code in such a manner that the addresses of said memory recording the codes each corresponding to a combination of the number of continuing 0s in the coefficient and the absolute value of the coefficient, are classified in accordance with the combination of the number of continuing 0s in the coefficient and the absolute value of the coefficient, and in each class, a flag identifying the class, the least significant bits of the coefficient having the continuing 0s, and the least significant bits of the absolute value of the coefficient are combined to generate the above mentioned address.

* * * * *